United States Patent
David et al.

(10) Patent No.: US 7,335,576 B2
(45) Date of Patent: Feb. 26, 2008

(54) METHOD FOR PRECISION INTEGRATED CIRCUIT DIE SINGULATION USING DIFFERENTIAL ETCH RATES

(75) Inventors: Ludwig David, Irvine, CA (US); James Yamaguchi, Laguna Niguel, CA (US); Stuart Clark, Newport Beach, CA (US); W. Eric Boyd, San Clemente, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 111 days.

(21) Appl. No.: 11/197,828

(22) Filed: Aug. 5, 2005

(65) Prior Publication Data

US 2006/0079072 A1 Apr. 13, 2006

Related U.S. Application Data

(60) Provisional application No. 60/628,742, filed on Nov. 18, 2004, provisional application No. 60/617,426, filed on Oct. 8, 2004.

(51) Int. Cl.
*H01L 21/00* (2006.01)

(52) U.S. Cl. .............................. 438/462; 257/E21.599

(58) Field of Classification Search ................ 438/110, 438/464, 742; 156/659
See application file for complete search history.

(56) References Cited

U.S. PATENT DOCUMENTS

| 4,997,789 | A | * | 3/1991 | Keller et al. ................. 438/643 |
| 5,259,925 | A | * | 11/1993 | Herrick et al. ............... 438/460 |
| 5,501,893 | A | | 3/1996 | Laermer et al. |
| 6,174,789 | B1 | | 1/2001 | Tsukada |
| 6,177,352 | B1 | | 1/2001 | Schonfeld et al. |
| 6,294,439 | B1 | * | 9/2001 | Sasaki et al. ................ 438/464 |
| 6,481,218 | B1 | * | 11/2002 | Drelser ........................ 62/50.6 |
| 6,645,832 | B2 | | 11/2003 | Kim et al. |
| 6,756,288 | B1 | | 6/2004 | Feil et al. |
| 6,806,167 | B2 | * | 10/2004 | Kuriyama .................... 438/460 |
| 6,841,455 | B2 | * | 1/2005 | West et al. .................. 438/462 |
| 7,129,114 | B2 | * | 10/2006 | Akram ........................ 438/110 |

FOREIGN PATENT DOCUMENTS

| DE | 4241045 | 5/1994 |
| EP | 1394851 | 3/2004 |

OTHER PUBLICATIONS

Hiber, Cyrille, Deep Anisotropic Etching of Silicon Using Low Pressure, High Density Plasma. White Paper, Undated, Swiss Fed Inst. of Tech., Center of Microtechnology.

* cited by examiner

*Primary Examiner*—David Zarneke
(74) *Attorney, Agent, or Firm*—W. Eric Boyd

(57) ABSTRACT

A preprocessed semiconductor substrate such as a wafer is provided with a metal etch mask which defines singulation channels on the substrate surface. An isotropic etch process is used to define a singulation channel with a first depth extending into the semiconductor substrate material. A second anisotropic etch process is used to increase the depth of the singulation channel while providing substantially vertical singulation channel sidewalls. The singulation channel can be extended through the depth of the substrate or, in an alternative embodiment, a predetermined portion of the inactive surface of the substrate removed to expose the singulation channels. In this manner, semiconductor die can be precisely singulated from a wafer while maintaining vertical die sidewalls.

14 Claims, 3 Drawing Sheets

METHOD FOR PRECISION INTEGRATED CIRCUIT DIE SINGULATION USING DIFFERENTIAL ETCH RATES

CROSS REFERENCE TO RELATED APPLICATIONS

The present application claims priority to U.S. provisional patent application Ser. No. 60/628,742, filed Nov. 18, 2004, and U.S. provisional patent application Ser. No. 60/617,426, filed Oct. 8, 2004, each of which are incorporated fully herein by reference and to which priority is claimed pursuant to 35 USC 119.

STATEMENT REGARDING FEDERALLY SPONSORED RESEARCH AND DEVELOPMENT

N/A

BACKGROUND OF THE INVENTION

1. Field of the Invention

The invention relates to semiconductor wafer processing. Specifically the invention relates to a method for the precise singulation of integrated circuit die from a semiconductor substrate.

2. Description of the Prior Art

Semiconductor processing generally comprises multiple photolithographic, etching, plating and doping steps to form an array of individual integrated circuit die on the surface of a semiconductor substrate such as a wafer. Integrated circuit die densities frequently range in the thousands of die per wafer, each die of which is separated from the others by a narrow inactive boundary referred to as a die "street". Once integrated circuit die fabrication and test at the wafer level is complete, the individual die are "singulated" from the wafer for subsequent leadframe attachment, wirebonding and encapsulation. Singulation is typically accomplished by cutting along the die streets using a dicing saw.

Automated dicing saws use specialty dicing blades commonly ranging from 1-10 mils in width, which singulate the individual die from the wafer by cutting along the die streets. This mechanical method of singulation retains the undesirable attributes of backside wafer chipping and the characteristic "kerf" along the saw cut, which is the width of the blade plus an additional width associated with mechanical tolerances of the saw and blade. For instance, a dicing blade that is 35 microns in width may have a 40-42 micron kerf width, dependent on saw set up.

Applications where very high tolerance die singulation is required cannot accommodate the tolerances associated with blade dicing or, for that matter, laser dicing. One such application relates to focal plane array integrated circuit chips used in four-sided, buttable stacks of interconnected die for use in large area mosaic focal plane detector arrays. In such applications, die edge tolerances must be one micron or less to minimize loss of optical information and to maintain the buttability of the stacks. The requirement of providing half-pixel or less separation between detector stacks can be met by defining the edge of a detector die using an optically precise, photolithographic-based dicing technique. Large arrays can be assembled from these stacks to form curved (concave or convex) mosaic focal plane arrays.

Precision die singulation applications have requirements for detector die to be diced within one micron of active features on the die. Standard precision dicing is on the order of ±3 microns and cannot meet the high tolerances noted above. Further, the edges of the detectors are required to be highly orthogonal to each other to ensure accurate buttability. Existing dicing means do not provide the necessary accuracy for the above applications.

What is needed is a method for precision die singulation method which overcomes these limitations in the prior art.

BRIEF SUMMARY OF THE INVENTION

The illustrated embodiments of the invention disclose a method which takes advantage of differential etch rates in semiconductor substrate materials by using one or more mask and etch steps and an optional back-thinning of a partially singulated wafer.

In a preferred embodiment, a semiconductor substrate, such as a wafer, with individual integrated circuit die formed thereon, is provided with a metal etch mask disposed over the integrated circuitry on the wafer. The etch mask defines exposed areas and unexposed (i.e., masked) areas on the surface of the wafer. A singulation channel is formed in the exposed areas using an isotropic reactive ion etch whereby the initial channel has a depth below the base field oxide on the substrate and into the silicon substrate itself. The etch mask is removed and subsequent anisotropic deep reactive ion etch is used to etch into the exposed silicon in the channel.

The channeled wafer is then back-thinned using mechanical, chemical or CMP methods to the depth of the channel whereby the individual die are singulated from the wafer by the back-thinning step.

Alternative embodiments may comprise, without limitation, one or more additional photoresist steps and varying etch depths and etch processes.

It is to be expressly understood that the invention also includes the product made from the method disclosed above.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

As is well known in the semiconductor manufacturing arts, a common series of semiconductor process steps is involved in the manufacturing of integrated circuit die.

Generally, such semiconductor process steps comprise:
1. Functional and schematic circuit design,
2. Circuit layout (which is dependent on factors such as feature size, material characteristics and foundry capabilities) resulting in a composite circuit layout or drawing from which individual circuit layer patterns are generated,
3. Digitizing each layer drawing,
4. Creating a reticle from each layer drawing comprising an image for directly patterning the image on a wafer or for the generation of a photomask which may comprise multiple reticle images. (Chrome on glass/quartz is a typical reticle construction),
5. Forming a base field oxide layer on the surface of a semiconductor wafer (also referred to as a substrate herein) to form a protective layer and doping barrier,
6. Patterning the oxide layer to define locations for circuit elements,
7. One or more additional layering, patterning and doping operations for the creation of desired circuit elements such as transistors (n-type and/or p-type), capacitors, diodes, resistors and the like, and the creation of insulation and/or conductive regions using appropriate passivation materials (e.g., polysilicon), dopants, and metallization. Typically, an oxynitride layer is formed over the wafer after fabrication to protect the underlying circuit elements from the environment and mechanical damage.
8. Upon completion of the above semiconductor process steps, wafer sort, test and dicing of the wafer for further processing typically follow.

Figure 1:
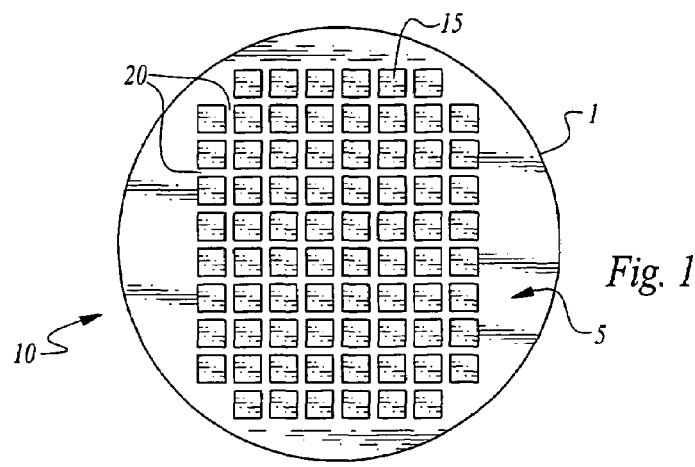
FIG. 1 is a top plan view of a semiconductor wafer with integrated circuit die formed thereon.

Turning to the figures wherein like numerals designate like elements among the several views, FIG. 1 shows a semiconductor substrate, or wafer 1, having a first surface 5 and a second surface 10. First surface 5 has one or more preformed integrated circuit die 15 formed thereon fabricated from the above semiconductor process steps, separated by inactive regions referred to herein as die streets 20. Prior art singulation methods typically involve blade or laser dicing along die streets 20.

Two etching processes are utilized in the disclosed invention; reactive ion etching (RIE) and deep reactive ion etching (DRIE).

Reactive ion etching involves the conversion of an etch gas into a plasma wherein an electrode is used to accelerate the ions in such a manner as to etch a semiconductor substrate using chemical and physical reactions. Reactive ion etching tends to exhibit undesirable isotropic etching characteristics (i.e., vertical and lateral etching under a photomask) that are not suitable for use where highly orthogonal sidewalls are desired.

Deep reactive ion etching is a variant of RIE that permits very high aspect ratio features to be fabricated with substantially orthogonal sidewalls because it is an anisotropic process. On the other hand, DRIE is not suitable for etching through the silicon oxide/dielectric features in the layers contained in integrated circuit die but is well-suited for bulk silicon etching. It is to be specifically noted that any anisotropic etching process capable of vertical sidewall etching in the substrate may be used in the present invention.

The disclosed invention takes advantage of several characteristics of semiconductor processing; 1) silicon dioxide etches very slowly compared to silicon in a deep reactive etching process, 2) metal patterns can be used as etch masks in a standard reactive etching process and, 3) accurate photoalignment of mask features to a tolerance of one micron or less cannot readily be achieved outside of a semiconductor foundry environment but can be obtained if the etch masks are patterned during the semiconductor processing steps at the semiconductor foundry.

Figure 2:
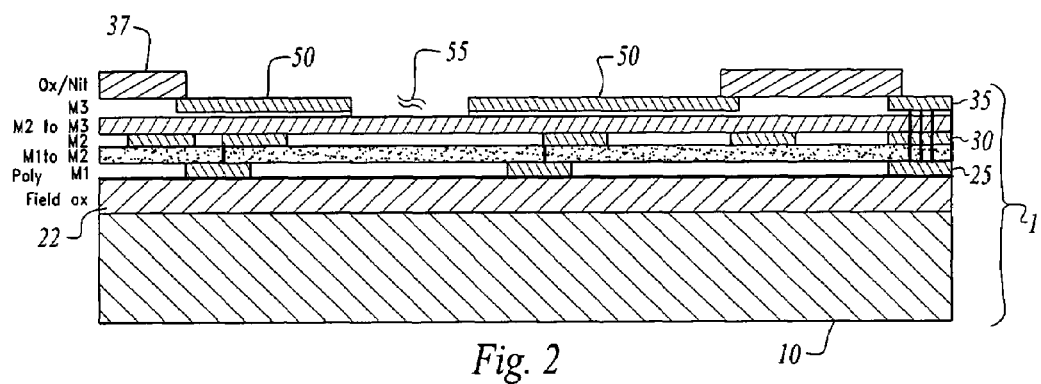
FIG. 2 is a cross-section of a wafer prior to the first etch step of the invention showing the oxynitride passivation layer removed to expose the etch mask.

As seen in FIG. 2, the cross section of substrate 1 shows multiple layers of an exemplar integrated circuit die which, in FIG. 2 generally comprise a base field oxide 22, a plurality of metal layers 25, 30 and 35, and an oxynitride passivation layer 37, all layers of which are built up upon first surface 5 of substrate 1. Metal layer 35 is the final metal layer and comprises at least one etch mask 50, preferably formed of a metal material, which defines an exposed first surface area 55. Tn a preferred embodiment, exposed surface area defines one or more die streets 20.

First surface area 55 effectively comprises a sacrificial etch region below die streets 20 which will be etched to create a singulation channel for subsequent die singulation. Note that etch mask 50 may be disposed at any layer of integrated circuit die 15 below which precision, orthogonal etching is desired, which is preferably above the final circuit element layer on a substrate or final metal layer provided at the semiconductor foundry.

A preferred embodiment of the invention incorporates defining a 1-2 micron thick, 50 micron wide, aluminum "ring" circumscribing the first surface area 55 on the wafer at the final metal layer. This step is performed during the above mentioned semiconductor processing steps to form an etch mask for subsequent silicon oxide etching. The definition of the etch mask at the reticle level during the semiconductor processing steps permits the very high precision singulation of the disclosed invention.

It has been determined that the aforementioned aluminum etch mask will etch during the RIE process, albeit at a much slower rate than the silicon oxide layers under first surface area 55. A typical etch ratio of silicon oxide to aluminum is approximately 6:1 during this process step. Accordingly, a 1-2 micron thick etch mask will allow a silicon oxide etch depth in the range of 6-12 microns before the etch mask is etched away by the process.

In cases where the entire active surface of a substrate is passivated after wafer fabrication, such as with an oxynitride layer, it will be necessary to expose the underlying preformed metal etch mask in a separate process step as is well known in the semiconductor arts.

Figure 3:
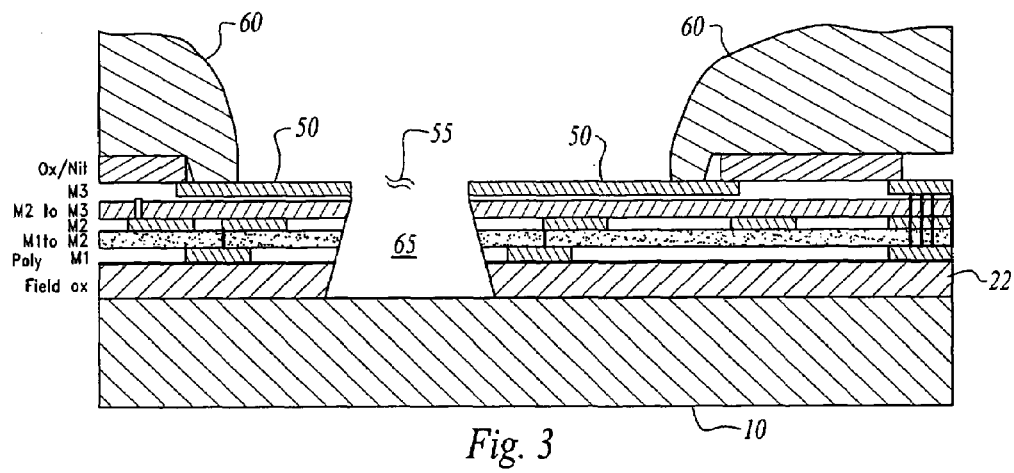
FIG. 3 is a cross-section of a wafer subsequent to the first isotropic etch step of the invention.

Referring to FIG. 3, a first photoresist 60 or equivalent structure is applied over the surface of substrate 1 where to protect the major portion of the substrate surface during the first RIE etching phase. First photoresist 60 should be applied such that only the metal etch mask 50 and the first surface areas to be etched are exposed to the RIE process. Failure to protect the remaining substrate surface could result in the undesirable etching of the surface passivation/ oxynitride layer of the wafer.

First surface area 55 is then exposed to an RIE etch process such as a CF4/SF6 process as is well known in the semiconductor processing arts.

Figure 4:
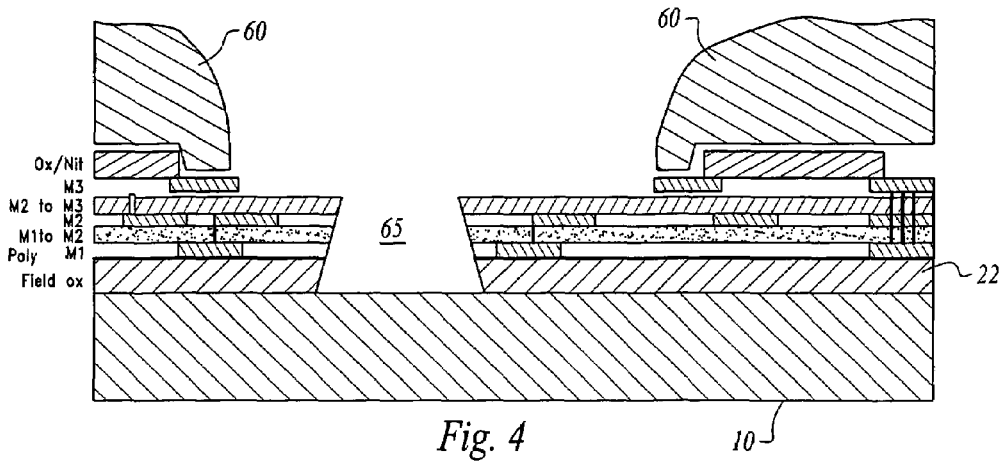
FIG. 4 is a cross-section of a wafer prior to the second anisotropic etch step of the invention after the remaining etch mask has been removed.
Figure 5:
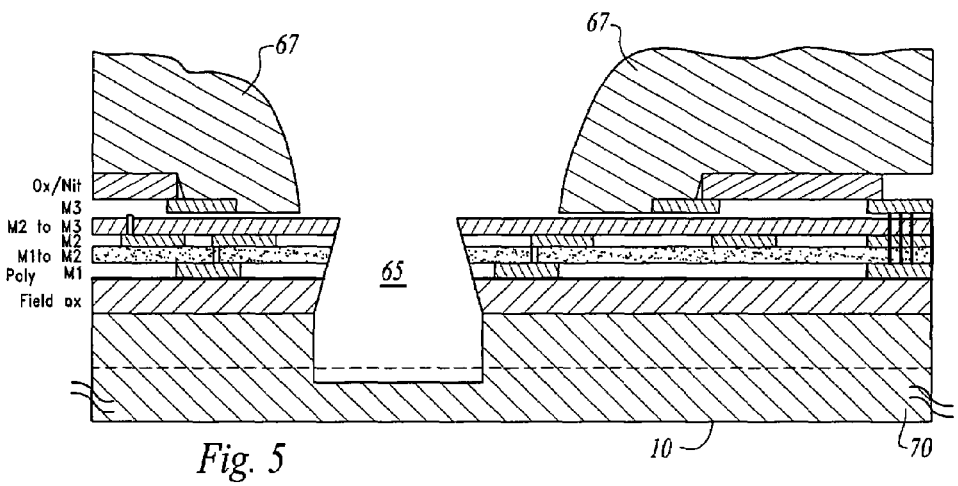
FIG. 5 is a cross-section of a wafer subsequent to the second anisotropic etch step of the invention.

As illustrated in FIG. 3, the silicon oxide layers below first surface area 55 have been etched to a predetermined first depth, preferably to a depth of 5-6 microns, to create a singulation channel 65. Singulation channel 65 is preferably a depth of at least that of the integrated circuit die layers and preferably penetrating below the lowermost field oxide layer 22 and exposing the semiconductor substrate material. Note the depth of singulation channel 65 will be increased in subsequent process steps to allow the precision singulation of integrated circuit die along the singulation channel Referring now to FIGS. 4 and 5, at this process step, remaining portions of etch mask 50 are substantially removed such as by a suitable etching step. This is necessary since the subsequent DRIE process is incompatible with exposed metal. A second photoresist step 67 is then applied to cover the remaining substrate surface areas other than those areas that will be exposed to the subsequent DRIE process.

First surface 5 is then exposed to a second etching process, preferably an anisotropic DRIE process such as is used in the creation of MEMS structures whereby the exposed silicon in singulation channel 65 is bulk etched. Such etching processes are very anisotropic and allow high aspect ratio etching in silicon. In a preferred embodiment, DRIE etch depths were on the order of 50-70 microns.

Two major DRIE processes, both of which are anisotropic, are applicable to the disclosed invention. The first DRIE fabrication method (i.e., etching that involves little or no undercutting under a photomask) involves alternating etching and passivation layer creation wherein an etch phase is followed by the deposition of a passivation layer. A common process is the use of SF6 in the etch phase and the use of a fluorocarbon (e.g., C4F8) in the passivation phase. A repeated etch phase occurs, primarily etching the base of the etched feature, penetrating and etching the passivation layer and underlying substrate while having a lesser effect on the sidewall. By repeating the above steps, a substantially vertical sidewall in an etched feature can be created, leaving a slightly scalloped vertical sidewall.

One such DRIE process is disclosed in U.S. Pat. No. 5,501,893 to Laermer, et al., entitled Method of Anisotropically Etching Silicon, the entirety of which is incorporated fully herein by reference.

An alternate DRIE process for use with the disclosed invention comprises the use cryogenic temperatures in the order of −100 C to −130 C to reduce the sidewall etch rate during the etch phase and can be used for through-wafer etching. This process uses spontaneous chemical etching using fluorine radicals (e.g. SF6) and using oxygen radicals (e.g., SiOxFy) for passivation to allow anisotropic etching.

In an alternative preferred embodiment, a predetermined portion 70 of second surface 10 is removed slightly beyond the depth of singulation channel 65, such as by lapping, grinding, polishing or chemical mechanical polishing (CMP) or equivalent processes as are well known in the semiconductor arts. When the floor of the singulation channel is exposed by this step, the individual die 15 are released from substrate 1 precisely along the singulation channel.

Because the geometry of singulation channel 65 was defined using optically precise photolithographic processes generally available only at a semiconductor foundry level, the alignment tolerances of etch mask 50 are very high. Further, because the singulation channels are formed using isotropic etching penetrating the very minimal depth of integrated circuit layers 15 and then using the anisotropic DRIE etching in the bulk silicon underneath, precision singulation along die streets 20 is achieved.

In an alternative embodiment of the invention, the second etching process, such as cryogenic DRIE process capable forming singulation channels through the entire depth of substrate 1, is used to avoid the need to backthin substrate 1.

Figure 6:
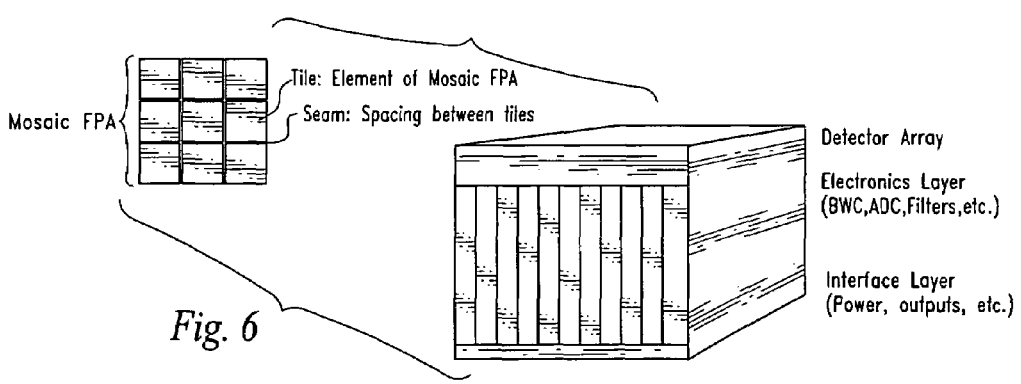
FIG. 6 is a view of a preferred embodiment of a focal plane array stack configuration formed from singulated die of the invention and shows the detector chip with interconnected support electronics in a "loaf of bread" orientation.

Turning to FIG. 6, a view of a preferred focal plane array stack configuration is shown, formed from singulated die of the invention and shows the detector chip with interconnected support electronics in a "loaf of bread" orientation.

Figures 7A, 7B:
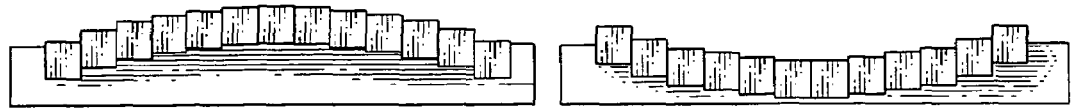
FIGS. 7a and 7b illustrate preferred embodiments of the invention in the configuration of a convex and concave large area mosaic focal plane array formed from a plurality of integrated circuit stacks.

FIGS. 7a and 7b illustrate a preferred configuration of a convex and concave large area mosaic focal plane array formed from a plurality of those stacks.

Figure 8:
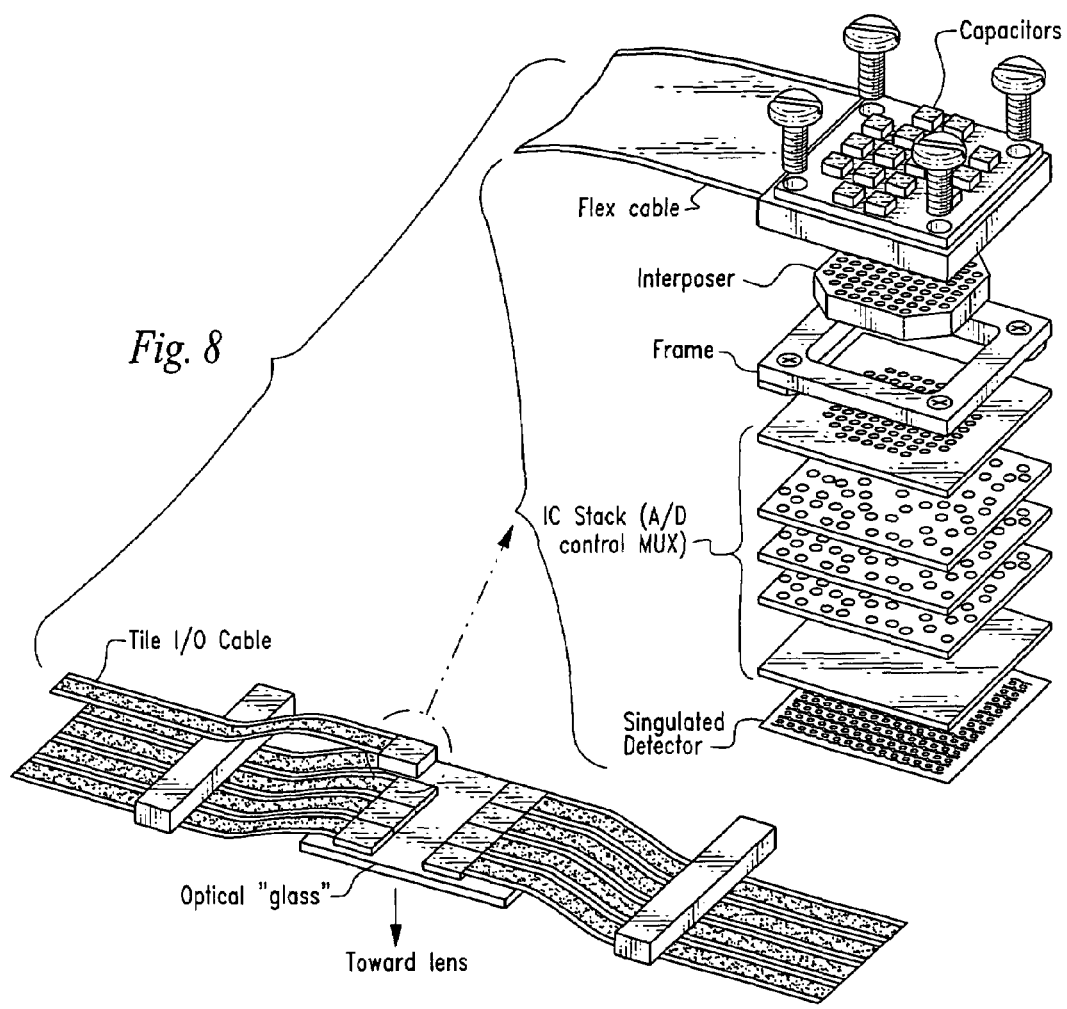
FIG. 8 shows yet a further preferred embodiment of a large area mosaic focal plane array with interconnected support electronics in a coplanar orientation.

FIG. 8 shows yet a further preferred embodiment of a large area mosaic focal plane array with interconnected support electronics in a coplanar orientation.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. A method for singulating an integrated circuit die from a semiconductor substrate comprised of the steps of:
   providing a semiconductor substrate comprising a first surface and a second surface,
   said first surface having at least one preformed integrated circuit die formed thereon,
   said integrated circuit die further comprising a metal etch mask as part of a metal layer defined by a reticle during at least one of the same semiconductor processing steps as used to fabricate said integrated circuit die in a set of semiconductor foundry processes,
   said metal etch mask disposed below a oxynitride passivation layer, to define a first surface area,
   defining a singulation channel with a predetermined first depth on said first surface area using a first etching process, and,
   increasing said first depth to a predetermined second depth using a second etching process.

2. The method of claim 1 further comprising the step of removing a predetermined portion of said second surface whereby said singulation channel is exposed on said second surface whereby said at least one integrated circuit die is singulated from said semiconductor substrate.

3. The method of claim 1 wherein said first etching process is a reactive ion etching process.

4. The method of claim 1 wherein said second etching process is a deep reactive ion etching process.

5. The method of claim 1 wherein said first etching process is an isotropic etching process.

6. The method of claim 1 wherein said second etching process is an anisotropic etching process.

7. The method of claim 1 wherein said first etching process is an isotropic etching process and said second etching process is an anisotropic etching process.

8. The method of claim 1 wherein said first etching process is a reactive ion etching process and said second etching process is a deep reactive ion etching process.

9. The method of claim 1 wherein said first depth is between 6-12 microns and said second depth is between 50 and 70 microns.

10. The method of claim 1 wherein said etch mask is comprised of aluminum.

11. The method of claim 1 wherein said etch mask is provided on said first surface during a series of semiconductor process steps.

12. The method of claim 2 wherein said predetermined portion is removed by a lapping process.

13. The method of claim 2 wherein said predetermined portion is removed by a CMP process.

14. The method of claim 6 wherein said anisotropic etching process is performed at a temperature of between about −100 C. and about −130 C.

* * * * *

UNITED STATES PATENT AND TRADEMARK OFFICE
CERTIFICATE OF CORRECTION

PATENT NO. : 7,335,576 B2  Page 1 of 1
APPLICATION NO. : 11/197828
DATED : February 26, 2008
INVENTOR(S) : David Ludwig et al.

It is certified that error appears in the above-identified patent and that said Letters Patent is hereby corrected as shown below:

On the Title Page Item (75) Inventors, "Ludwig David" should be -- David Ludwig --.

On the Title Page Item (75) Inventors, "Stuart Clark" should be -- Stewart Clark --.

Signed and Sealed this

Fifth Day of August, 2008

JON W. DUDAS
*Director of the United States Patent and Trademark Office*